(12) United States Patent
Lee et al.

(10) Patent No.: US 10,886,489 B2
(45) Date of Patent: Jan. 5, 2021

(54) FLEXIBLE ELECTROLUMINESCENCE DISPLAY

(71) Applicant: LG Display Co., Ltd., Seoul (KR)

(72) Inventors: MinJic Lee, Paju-si (KR); HongSik Kim, Paju-si (KR); Yeseul Han, Paju-si (KR); JeongOk Jo, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/687,211

(22) Filed: Nov. 18, 2019

(65) Prior Publication Data

US 2020/0176699 A1 Jun. 4, 2020

(30) Foreign Application Priority Data

Dec. 3, 2018 (KR) .......................... 10-2018-0153684

(51) Int. Cl.
*H01L 51/50* (2006.01)
*H01L 27/32* (2006.01)

(52) U.S. Cl.
CPC ........ *H01L 51/504* (2013.01); *H01L 27/3246* (2013.01); *H01L 27/3248* (2013.01); *H01L 27/3262* (2013.01); *H01L 27/3276* (2013.01); *H01L 2251/5338* (2013.01)

(58) Field of Classification Search
CPC ......... H01L 2251/5338; H01L 23/4985; H01L 51/0097; H01L 51/504
See application file for complete search history.

(56) References Cited

U.S. PATENT DOCUMENTS

2015/0179728 A1* 6/2015 Kwon ................ H01L 51/0097
257/40
2018/0053816 A1* 2/2018 Choi ................... H01L 27/3276

* cited by examiner

*Primary Examiner* — Caridad Everhart
(74) *Attorney, Agent, or Firm* — Fenwick & West LLP

(57) ABSTRACT

Disclosed is an electroluminescence display device. The electroluminescence display device includes a flexible substrate, a first metal layer, an inorganic material layer, a recessed portion, a second metal layer, and an organic material layer. The flexible substrate has a bending axis. The first metal layer is disposed on the flexible substrate to be parallel with the bending axis. The inorganic material layer is stacked on the first metal layer. The recessed portion is disposed in the inorganic material layer to be parallel to the bending axis and exposes the first metal layer. The second metal layer extends in parallel to the bending axis, covers the recessed portion, and is in contact with the first metal layer. The organic material layer covers the inorganic material layer and the second metal layer.

16 Claims, 5 Drawing Sheets

FLEXIBLE ELECTROLUMINESCENCE DISPLAY

CROSS-REFERENCE TO RELATED APPLICATIONS

This application claims the benefit of the Republic of Korea Patent Application No. 10-2018-0153684 filed on Dec. 3, 2018, which is hereby incorporated by reference in its entirety.

TECHNICAL FIELD

The present disclosure relates to a flexible electroluminescence display device. Particularly, the present disclosure relates to a flexible electroluminescence display device having a structure which is robust to a bending stress when a display area is folded and unfolded or rolled and unrolled.

BACKGROUND ART

An electroluminescence (EL) display device employs a spontaneous emission system, has a viewing angle, a contrast ratio, and the like which are excellent, and can be decreased in weight and thickness and is advantageous in power consumption because a separate backlight is not required. Particularly, an organic light emitting display (OLED) device out of such EL display devices can be driven with a low direct current (DC) voltage, has a high response speed, and has low manufacturing costs.

An EL display device includes a plurality of electroluminescence (EL) diodes. An EL diode includes an anode electrode, a light emitting layer that is formed on the anode electrode, and a cathode electrode that is formed on the light emitting layer. When a high-potential voltage is applied to the anode electrode and a low-potential voltage is applied to the cathode electrode, holes in the anode electrode and electrons in the cathode electrode move to the lighting emitting layer. When holes and electrons are coupled in the light emitting layer, excitons are formed in the course of excitation and light is generated due to energy form the excitons. An EL display device displays an image by electrically controlling a quantity of light which is generated in the light emitting layers of a plurality of EL diodes which are individually partitioned by banks.

An EL display device can be much decreased in thickness and can efficiently utilize flexibility which is a feature of an organic material. A foldable display device that can be folded and unfolded if necessary or a rollable display device that can be rolled for storage and be unrolled for use can be easily developed using excellent flexibility. However, when folding and unfolding motions are repeated, cracking or damage may be caused in a folded part due to a bending stress. When such damage is caused, moisture or particles may permeate the rollable or foldable EL display device from the outside via the damaged portion, which may cause a decrease in lifespan of the EL display device.

SUMMARY

The present disclosure provides a flexible electroluminescence display device that can minimize a bending stress to prevent cracking or damage even when folding and unfolding motions are repeated. The present disclosure also provides a flexible electroluminescence display device having a structure that can absorb a stress due to repeated bending motions and prevent permeation of moisture from the outside.

An electroluminescence display device according to an embodiment of the present disclosure includes a flexible substrate, a first metal layer, an inorganic material layer, a recessed portion, a second metal layer, and an organic material layer. The flexible substrate has a bending axis. The first metal layer is disposed on the flexible substrate to be parallel with the bending axis. The inorganic material layer is stacked on the first metal layer. The recessed portion is disposed in the inorganic material layer to be parallel to the bending axis and exposes the first metal layer. The second metal layer extends in parallel to the bending axis, covers the recessed portion, and is in contact with the first metal layer. The organic material layer covers the inorganic material layer and the second metal layer.

For example, the inorganic material layer may include an inorganic buffer layer, a gate insulating film, and an intermediate insulating film. The organic material layer may include an organic insulating film, a planarization film, and a bank.

For example, the flexible substrate may include a display area and a non-display area. In the display area, a plurality of pixels may be arranged in a matrix. The non-display area may be disposed to surround the display area. Each pixel may include a light emitting element and a thin-film transistor that drives the light emitting element.

For example, the pixels may be defined by scan lines which are arranged in a first direction of the flexible substrate and data lines and driving current lines which are arranged in a second direction of the flexible substrate. The thin-film transistors may be connected to the scan lines, the data lines, and the driving current lines. The light emitting elements may be connected to the thin-film transistors.

For example, the electroluminescence display device may further include an inorganic buffer layer, a semiconductor layer, a gate insulating film, a gate electrode, an intermediate insulating film, and an organic insulating film. The inorganic buffer layer may be stacked on the flexible substrate to expose the first metal layer. The semiconductor layer may be formed on the inorganic buffer layer. The gate insulating film may be formed to cover the semiconductor layer and expose the first metal layer. The gate electrode may be formed on the gate insulating film to overlap a central portion of the semiconductor layer. The intermediate insulating film may be formed to cover the gate electrode and the semiconductor layer and expose the first metal layer. The organic insulating film may be formed on the intermediate insulating film to cover the intermediate insulating film and the second metal layer connected to the first metal layer via the recessed portion.

For example, the electroluminescence display device may further include a source electrode, a drain electrode, a planarization film, a pixel electrode, a bank, a light emitting layer, and a common electrode. The source electrode may be formed on the organic insulating film and be connected to one side of the semiconductor layer. The drain electrode may be formed on the organic insulating film and be connected to the other side of the semiconductor layer. The planarization film may be formed to cover the organic insulating film, the source electrode, and the drain electrode. The pixel electrode may be formed on the planarization film and be connected to the drain electrode. The bank may be formed on the planarization film to expose a central area of the pixel electrode. The light emitting layer may be stacked on the pixel electrode which is exposed from the bank. The common electrode may be stacked on the light emitting layer. The organic insulating film, the planarization film, and the bank may be stacked in the recessed portion.

For example, the recessed portion may cross the flexible substrate along the bending axis. A plurality of recessed portions of which each is identical to the recessed portion may be arranged at constant intervals in a direction perpendicular to the bending axis.

For example, a plurality of recessed portions may be disposed in a partial area including a folding area which is set on the flexible substrate.

For example, the recessed portions may be disposed in a constant distribution on the entire area of the flexible substrate.

An electroluminescence display device according to another embodiment of the present disclosure includes a flexible substrate, a bending axis, a thin-film transistor layer, a planarization film, a light emitting element, and a trench bar. The bending axis is set to a first direction of the flexible substrate. The thin-film transistor layer is stacked on the flexible substrate. The planarization film is stacked on the thin-film transistor layer. The light emitting element is formed on the planarization film. The trench bar is formed in the first direction on the flexible substrate. The trench bar includes a recessed portion, a first metal material layer, and a second metal material layer. The recessed portion is disposed between the flexible substrate and the planarization film to cross the flexible substrate in the first direction. The first metal material layer is disposed under of the recessed portion. The second metal material layer is disposed on the recessed portion and is in contact with the first metal material layer.

For example, the light emitting element includes a pixel electrode, a bank, a light emitting layer, and a common electrode. The pixel electrode is formed on the planarization film and is connected to a thin-film transistor included in the thin-film transistor layer. The bank defines an emission area in the pixel electrode. The light emitting layer is stacked on the bank and the pixel electrode. The common electrode is stacked on the light emitting layer.

For example, the thin-film transistor layer includes a light blocking layer, an inorganic buffer layer, a semiconductor layer, a gate insulating film, a gate electrode, an inorganic insulating film, an organic insulating film, a source electrode, and a drain electrode. The light blocking layer may be formed on the flexible substrate. The inorganic buffer layer may be formed to cover the light blocking layer. The semiconductor layer may be formed in an area of the light blocking layer and on the inorganic buffer layer. The gate insulating film may be formed to cover the semiconductor layer. The gate electrode may be formed on the gate insulating film to overlap a central portion of the semiconductor layer. The inorganic insulating film may be formed to cover the gate insulating film and the gate electrode. The organic insulating film may be stacked on the inorganic insulating film. The source electrode may be formed on the organic insulating film and be in contact with one side of the semiconductor layer. The drain electrode may be formed on the organic insulating film and be in contact with the other side of the semiconductor layer.

For example, the second metal layer, the organic insulating film, the planarization film, and the bank may be sequentially stacked on the recessed portion.

For example, the organic insulating film may fill the recessed portion on the second metal layer to make the top surface of the organic insulating film flat.

For example, a plurality of recessed portions may be disposed in a partial area including a folding area which is set on the flexible substrate.

For example, the recessed portions may be disposed in a constant distribution on the entire area of the flexible substrate.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain the principle of the disclosure. In the drawings.

DETAILED DESCRIPTION

Figure 1:
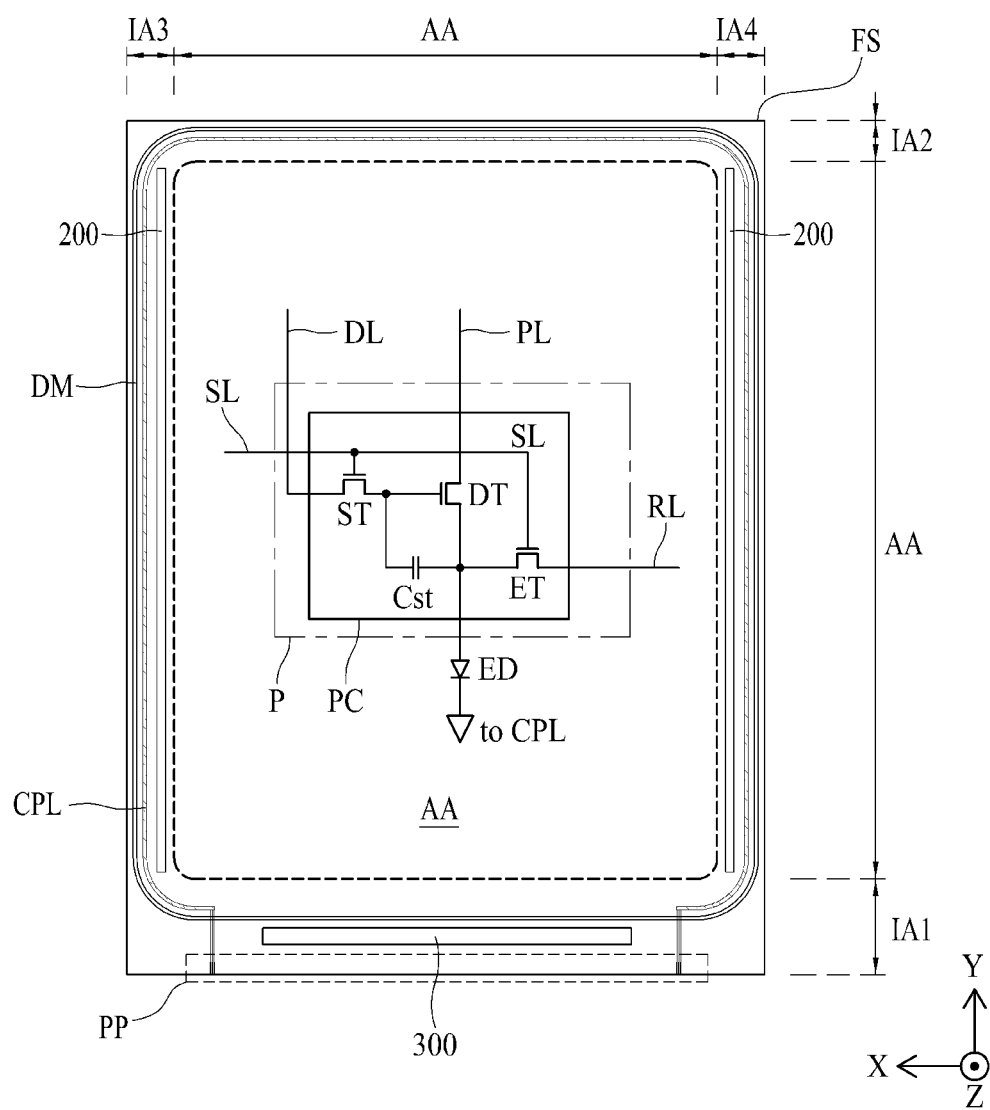
FIG. 1 is a plan view illustrating a flexible electroluminescence display device according to the present disclosure.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Furthermore, the present disclosure is only defined by scopes of claims.

A shape, a size, a ratio, an angle, and a number disclosed in the drawings for describing embodiments of the present disclosure are merely an example, and thus the present disclosure is not limited to the illustrated details. Like reference numerals refer to like elements throughout. In the following description, when the detailed description of the relevant known technology is determined to unnecessarily obscure the important point of the present disclosure, the detailed description will be omitted.

In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a positional relationship, for example, when a position relation between two parts is described as 'on~', 'over~', 'under~', and 'next~', one or more other parts may be disposed between the two parts unless 'just' or 'direct' is used.

In describing a temporal relationship, for example, when the temporal order is described as 'after~', 'subsequent~', 'next~', and 'before~' a case which is not continuous may be included unless 'just' or 'direct' is used.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

A flexible electroluminescence display device according to the present disclosure will be described below in detail with reference to the accompanying drawings. In the drawings, the same elements will be referred to by the same reference signs as much as possible.

FIG. 1 is a plan view illustrating a flexible electroluminescence display device according to the present disclosure. Referring to FIG. 1, a flexible electroluminescence display device according to the present disclosure includes a flexible substrate FS, pixels P, common power supply lines CPL, a gate driving circuit 200, a dam structure DM, and a driving integrated circuit 300.

The flexible substrate FS is a base board (or a base layer) and is formed of a plastic material or a glass material. In one embodiment, a flexible display device is formed of a plastic material having excellent flexibility. Even a glass material can be formed with a thin thickness to embody a flexible display device.

For example, the flexible substrate FS two-dimensionally has a quadrangular shape, a quadrangular shape of which corners are rounded with a predetermined radius of curvature, or a non-quadrangular shape having at least six sides. Here, the flexible substrate FS having a non-quadrangular shape includes at least one protruding portion or at least one notched portion.

For example, the flexible substrate FS may be partitioned into a display area AA and a non-display area IA. The display area AA is provided in a substantially middle part of the flexible substrate FS and is defined as an area for displaying an image. For example, the display area AA has a quadrangular shape, a quadrangular shape of which corners are rounded with a predetermined radius of curvature, or a non-quadrangular shape having at least six sides. Here, the display area AA having a non-quadrangular shape includes at least one protruding portion or at least one notched portion.

The non-display area IA is provided in edges of the flexible substrate FS to surround the display area AA and is defined as an area in which an image is not displayed or a circumferential area. For example, the non-display area IA includes a first non-display area IA1 that is provided at a first edge of the substrate, a second non-display area IA2 that is provided at a second edge of the flexible substrate FS which is parallel to the first non-display area IA1, a third non-display area IA3 that is provided at a third edge of the flexible substrate FS, and a fourth non-display area IA4 that is provided at a fourth edge of the flexible substrate FS which is parallel to the third non-display area IA3. For example, the first non-display area IA1 may be an upper (or lower) edge area of the flexible substrate FS, the second non-display area IA2 may be a lower (or upper) edge area of the flexible substrate FS, the third non-display area IA3 may be a left (or right) edge area of the flexible substrate FS, and the fourth non-display area IA4 may be a right (or left) edge area of the flexible substrate FS, but the present disclosure is not limited thereto.

The pixels P are disposed in the display area AA of the flexible substrate FS. For example, a plurality of pixels may be disposed in a matrix in the display area AA of the flexible substrate FS. The pixels P are disposed in areas which are defined by scan lines SL, sensing lines RL, data lines DL, and pixel driving power supply lines PL, respectively.

The scan lines SL extend in a first direction X and are disposed at predetermined intervals in a second direction Y crossing the first direction X. The display area AA of the flexible substrate FS includes a plurality of scan lines SL that are parallel to each other in the first direction X and are separated from each other in the second direction Y. Here, the first direction X is defined as a horizontal direction of the flexible substrate FS and the second direction Y is defined as a vertical direction of the flexible substrate FS, but the present disclosure is not limited thereto and may be defined on the contrary thereto.

The sensing lines RL are disposed on the flexible substrate FS to be parallel to the scan lines SL. The display area AA of the flexible substrate FS includes a plurality of sensing lines RL extending in parallel to the scan lines SL. In some cases, the sensing lines RL may further include vertical sensing lines which are parallel to the data lines.

The data lines DL extend in the second direction Y and are disposed at predetermined intervals in the first direction X. The display area AA of the flexible substrate FS includes a plurality of data lines DL that are parallel to the second direction Y and are separated from each other in the first direction X.

The pixel driving power supply lines PL are disposed on the flexible substrate FS to be parallel to the data lines DL. The display area AA of the flexible substrate FS includes a plurality of pixel driving power supply lines PL that are parallel to the data lines DL. Selectively, the pixel driving power supply lines PL may be disposed to be parallel to the scan lines SL.

For example, the pixels P may be disposed in a stripe pattern in the display area AA. In this case, one unit pixel includes a red subpixel, a green subpixel, and a blue subpixel, and the unit pixel may further include a white subpixel.

For example, the pixels P may be disposed in a pentile structure in the display area AA. In this case, a unit pixel includes at least one red subpixel, at least two green subpixels, and at least one blue subpixel which are disposed in a two-dimensional polygonal shape. For example, in one unit pixel having a pentile structure, one red subpixel, two green subpixels, and one blue subpixel are two-dimensionally disposed in an octagonal shape. In this case, the blue subpixel has an opening area (or an emission area) which is the largest, and the green subpixel has an opening area which is the smallest.

Each pixel P includes a pixel circuit PC that is electrically connected to the corresponding scan line SL, the corresponding sensing line RL, the corresponding data line DL, and the corresponding pixel driving power supply line PL, and a light emitting element ED that is electrically connected to the pixel circuit PC.

The pixel circuit PC controls a current flowing from the pixel driving power supply line PL to the light emitting element ED on the basis of a data voltage which is supplied from the data line DL in response to a scan signal which is supplied from at least one scan line SL.

For example, each pixel circuit PC includes at least two thin-film transistors and one capacitor. For example, each pixel circuit PC may include a driving thin-film transistor DT that supplies a data current based on a data voltage to the light emitting element ED, a switching thin-film transistor ST that supplies the data voltage supplied from the data line DL to the driving thin-film transistor DT, and a capacitor Cst that stores a gate-source voltage of the driving thin-film transistor DT.

For example, each pixel circuit PC may include at least three thin-film transistors and at least one capacitor. For example, the pixel circuit PC includes a current supply circuit, a data supply circuit, and a compensation circuit depending on operations (or functions) of the at least three thin-film transistors. Here, the current supply circuit includes a driving thin-film transistor DT that supplies a data current based on a data voltage to the light emitting element ED. The data supply circuit includes at least one switching thin-film transistor ST that supplies the data voltage supplied form the data line DL to the current supply circuit in response to at least one scan signal. The compensation circuit includes at least one compensation thin-film transistor ET that compensates for change in characteristic values (a threshold voltage and/or mobility) of the driving thin-film transistor DT in response to at least one scan signal.

Each light emitting element ED emits light with luminance corresponding to the data current in response to the data current which is supplied from the pixel circuit PC. In this case, the data current flows from the pixel driving power supply line PL to a common power supply line CPL via the light emitting element ED.

For example, each light emitting element ED may include an inorganic light emitting diode or an organic light emitting diode. For example, each light emitting element ED includes a pixel driving electrode AE (or a first electrode or an anode) that is electrically connected to a pixel circuit PC, a light emitting layer EL that is formed on the pixel driving electrode AE, and a common electrode CE (or a second electrode or a cathode) that is electrically connected to the light emitting layer EL.

The common power supply line CPL is disposed in the non-display area IA of the flexible substrate FS and is electrically connected to the common electrode CE disposed in the display area AA. For example, the common power supply line CPL is disposed along the second to fourth non-display areas IA2, IA3, and IA4 which are adjacent to the display area AA of the flexible substrate FS with a constant line width and surrounds parts of the display area AA other than the part adjacent to the first non-display area IA1 of the flexible substrate FS. One end of the common power supply line CPL is disposed on one side of the first non-display area IA1 and the other end of the common power supply line CPL is disposed on the other side of the first non-display area IA1. One end and the other end of the common power supply line CPL are disposed to surround the second to fourth non-display areas IA2, IA3, and IA4. Accordingly, the common power supply line CPL has two-dimensionally a "∩-shape" in which one side corresponding to the first non-display area IA1 of the flexible substrate FS is open.

The encapsulation layer is formed on the flexible substrate FS to surround the display area AA and the top surface and the side surface of the common power supply line CPL. On the other hand, the encapsulation layer exposes one end and the other end of the common power supply line CPL in the first non-display area IA1. The encapsulation layer serves to prevent oxygen or moisture from permeating the light emitting elements ED which are disposed in the display area AA. For example, the encapsulation layer may include at least one inorganic film. For example, the encapsulation layer may include a plurality of inorganic films and an organic film interposed between the plurality of inorganic films.

A driving unit according to an embodiment of the present disclosure includes a pad part PP, a gate driving circuit 200, and a driving integrated circuit 300.

The pad part PP includes a plurality of pads which are provided in the non-display area IA of the flexible substrate FS. For example, the pad part PP may include a plurality of common power supply pads, a plurality of data input pads, a plurality of power supply pads, and a plurality of control signal input pads which are provided in the first non-display area IA1 of the flexible substrate FS.

The gate driving circuit 200 is provided in the third non-display area IA3 and/or the fourth non-display area IA4 of the flexible substrate FS and is connected to the scan lines SL provided in the display area AA in a one-to-one correspondence manner. The gate driving circuit 200 is formed as an integrated circuit in the third non-display area IA3 and/or the fourth non-display area IA4 of the flexible substrate FS in the same process as a process of manufacturing the pixels P, that is, a process of manufacturing the thin-film transistors. The gate driving circuit 200 drives a plurality of scan lines SL in a predetermined order by generating a scan signal on the basis of a gate control signal supplied from the driving integrated circuit 300 and outputting the generated scan signals in a predetermined order. For example, the gate driving circuit 200 may include a shift register.

A dam structure DM is provided in the first non-display area IA1, the second non-display area IA2, the third non-display area IA3, and the fourth non-display area IA4 of the substrate SUB, and has a closed curve structure surrounding the display area AA. For example, the dam structure DM is disposed outside the common power supply line CPL and is located in the outermost part on the substrate SUB. The pad part PP and the driving integrated circuit 300 are disposed in an area outside the dam structure DM in one embodiment.

The dam structure DM is disposed in the outermost part in FIG. 1, but the present disclosure is not limited thereto. For example, the dam structure DM may be disposed between the common power supply line CPL and the gate driving circuit 200. For example, the dam structure DM may be disposed between the display area AA and the driving integrated circuit 300.

The driving integrated circuit 300 is mounted in a chip mounting area which is defined in the first non-display area IA1 of the flexible substrate FS through a chip mounting (or bonding) process. Input terminals of the driving integrated circuit 300 are directly connected to the pad part PP and thus a plurality of data lines DL provided in the display area AA are electrically connected to a plurality of pixel driving power supply lines PL. The driving integrated circuit 300 receives various powers, a timing synchronization signal, and digital image data from a display driving circuit unit (or a host circuit) via the pad part PP, generates gate control signals on the basis of the timing synchronization signal, controls driving of the gate driving circuit 200, converts the digital image data into analog pixel data voltages, and supplies the analog pixel data voltages to the corresponding data lines DL.

When the driving integrated circuit 300 is mounted in the form of a chip, the driving integrated circuit 300 is mounted in a part which is not folded in the foldable or rollable display device in one embodiment. For example, as illustrated in FIG. 1, the driving integrated circuit 300 is mounted in parallel to a lower edge which is not to be folded or rolled.

Hereinafter, an exemplary embodiment of the present disclosure will be described in detail with reference to enlarged views and/or sectional views illustrating structural features of the present disclosure. Particularly, a trench structure that can prevent damage due to a bending stress in the foldable or rollable display device will be described in detail.

Figure 2A:
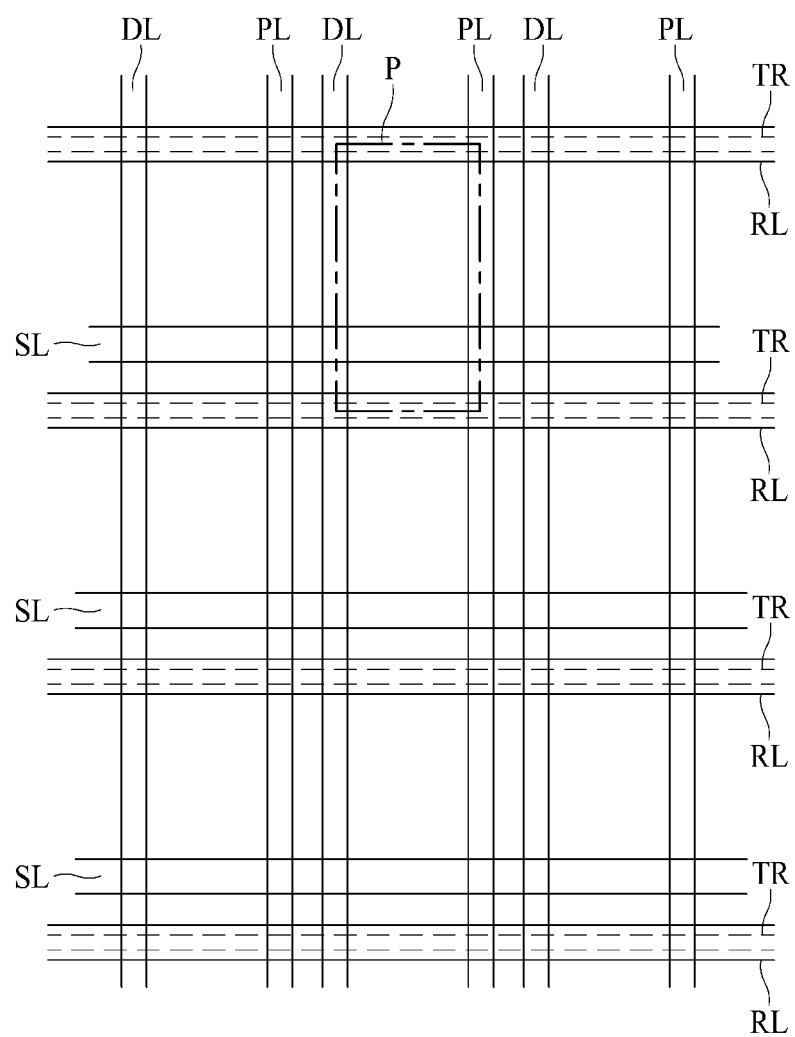
FIG. 2A is an enlarged plan view illustrating an arrangement structure of trenches in a flexible electroluminescence display device according to an exemplary embodiment of the present disclosure.
Figure 2B:
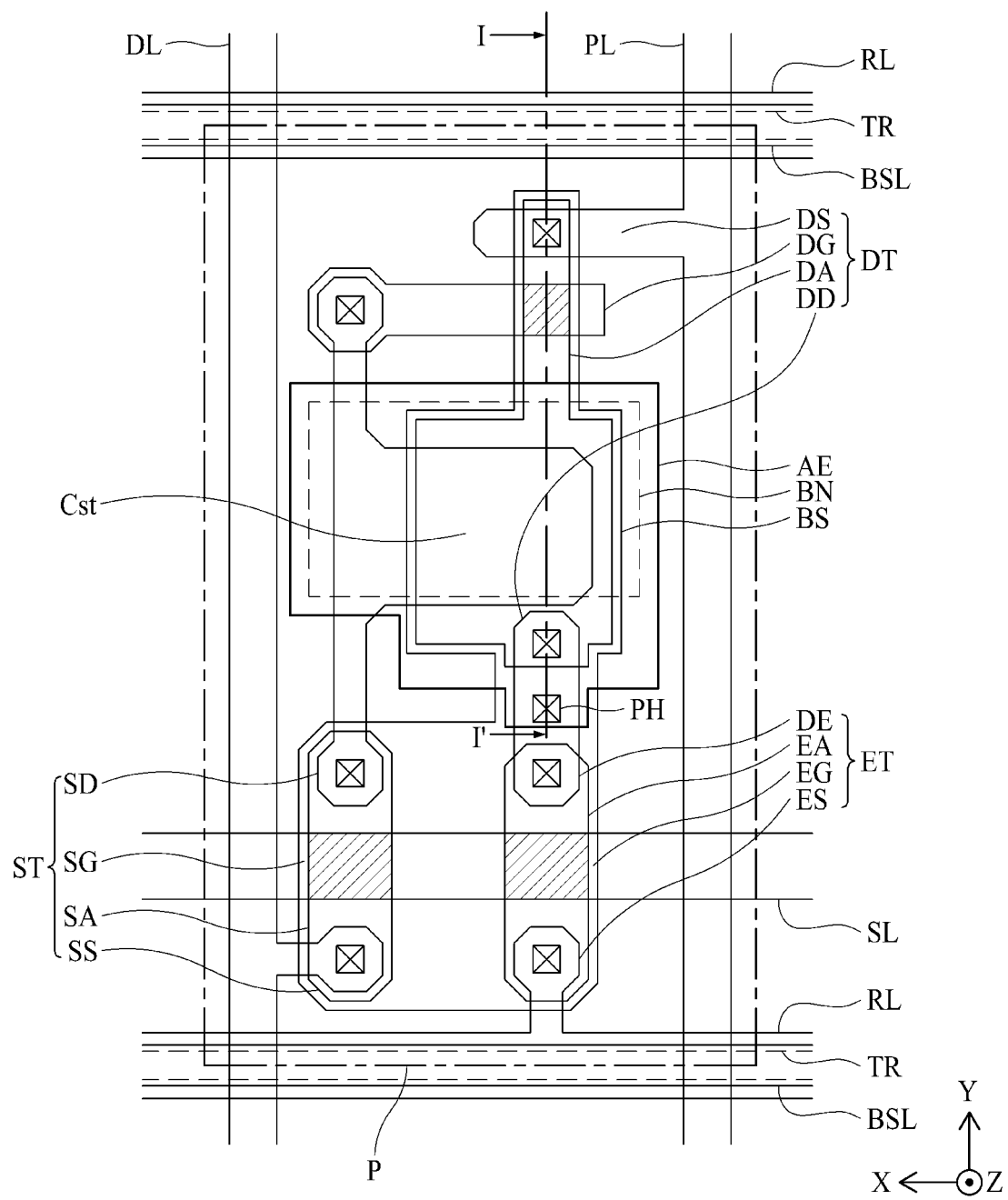
FIG. 2B is an enlarged plan view illustrating a structure of a unit pixel in a flexible electroluminescence display device according to an exemplary embodiment of the present disclosure.
Figure 3:
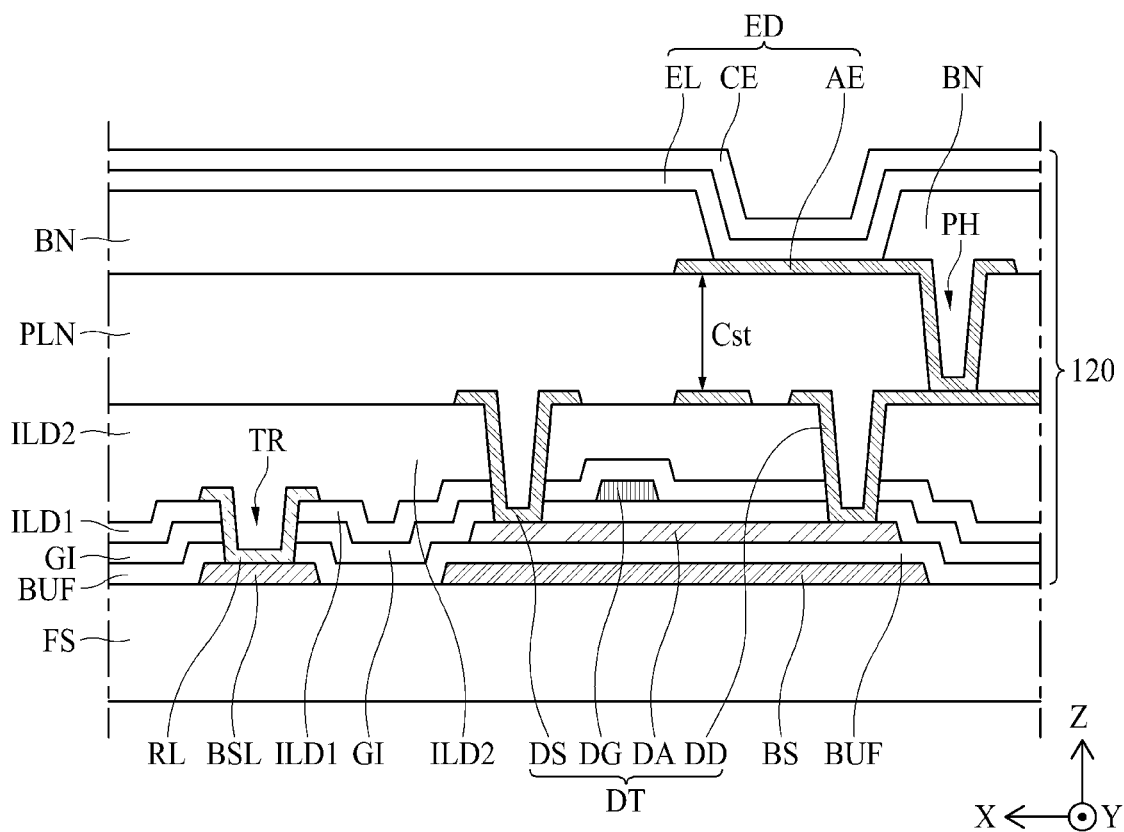
FIG. 3 is a sectional view taken along line I-I' in FIG. 2B and illustrates a structure of a flexible electroluminescence display device according to an exemplary embodiment of the present disclosure.

An exemplary embodiment of the present disclosure will be described below with reference to FIGS. 2A, 2B, and 3. If necessary, FIG. 1 will be referred to together. FIG. 2A is an enlarged plan view illustrating an arrangement structure of trenches in a flexible electroluminescence display device according to an exemplary embodiment of the present disclosure. FIG. 2B is an enlarged plan view illustrating a structure of a unit pixel in a flexible electroluminescence display device according to an exemplary embodiment of the present disclosure. FIG. 3 is a sectional view taken along line I-I' in FIG. 2B and illustrates a structure of a flexible electroluminescence display device according to an exemplary embodiment of the present disclosure.

A flexible electroluminescence display device according to an embodiment of the present disclosure includes a plurality of pixels P that are arranged in a matrix on a flexible substrate FS. The flexible substrate FS includes scan lines SL and sensing lines RL that are arranged in a transverse direction and data lines DL and pixel driving power supply lines PL that are arranged in a longitudinal direction. Areas of the pixels P are defined by these lines. In FIG. 2A, one pixel P is defined by a quadrangular area between two neighboring sensing lines RL and between two neighboring data lines and pixel driving power supply lines PL.

For example, the flexible electroluminescence display device according to the present disclosure includes trenches TR that are disposed on the flexible substrate FS to overlap the sensing lines RL. The trenches TR are arranged in parallel to a bending axis of the flexible substrate FS in one embodiment. For example, when the flexible electroluminescence display device has the bending axis on an X axis, the trenches TR are arranged in parallel to the X axis to cross the entire width of the flexible substrate FS. For example, the trenches TR may have a line shape that extends from the left end of the third non-display area IA3 of the flexible substrate FS to the right end of the fourth non-display area IA4.

Since the trenches TR are formed by removing inorganic material films, the trenches have a structure that can reduce permeation and/or diffusion of moisture from the outside in one embodiment. For this purpose, a lower metal layer formed along with a light blocking layer are disposed under each trench TR and a sensing line RL is stacked on top of the trench TR. Particularly, the width of the trench TR is less than the width of the lower metal layer BSL and the sensing line RL.

A pixel structure of a flexible electroluminescence display device according to an embodiment of the present disclosure will be described in detail with reference to FIG. 2B. A switching thin-film transistor ST, a driving thin-film transistor DT, a compensation thin-film transistor ET, a capacitor Cst, and a pixel driving electrode AE are disposed in an area of a pixel P. A light emitting layer EL and a common electrode CE are sequentially stacked on the pixel driving electrode AE to constitute a light emitting element ED.

The switching thin-film transistor ST operates such that a data signal which is supplied via a data line DL in response to a scan signal supplied via a scan line SL is stored as a data voltage in the capacitor Cst. The driving thin-film transistor DT operates such that driving current flows between a pixel driving power supply line PL and a common power supply line CPL according to the data voltage stored in the capacitor Cst. The light emitting element ED emits light according to the driving current flowing by the driving thin-film transistor DT. The compensation thin-film transistor ET is a circuit that is disposed in the pixel to compensate for a threshold voltage of the driving thin-film transistor DT or the like. The compensation thin-film transistor ET is connected to the drain electrode of the driving thin-film transistor DT and the pixel driving electrode AE (or a sensing node) of the light emitting element ED. The compensation thin-film transistor ET operates to supply an initialization voltage from the sensing line RL to the sensing node or to detect a voltage or a current of the sensing node.

In the switching thin-film transistor ST, the source electrode SS is connected to the data line DL and the drain electrode SD is connected to the gate electrode DG of the driving thin-film transistor DT. In the driving thin-film transistor DT, the source electrode DS is connected to the pixel driving power supply line PL, and the drain electrode DD is connected to the pixel driving electrode AE of the light emitting element ED. In the capacitor Cst, a first electrode is connected to the gate electrode DG of the driving thin-film transistor DT and a second electrode is connected to the pixel driving electrode AE of the light emitting element ED.

In the light emitting element ED, the pixel driving electrode AE is connected to the drain electrode DD of the driving thin-film transistor DT and the common electrode CE is connected to the common power supply line CPL. In the compensation thin-film transistor ET, the source electrode ES is connected to the sensing line RL and the drain electrode DE is connected to the pixel driving electrode AE of the light emitting element ED.

The scan line SL overlaps semiconductor layers SA and EA of the switching thin-film transistor ST and the compensation thin-film transistor ET. A part of the scan line SL overlapping the scan semiconductor layer SA is a scan gate electrode SG, and a region of the scan semiconductor layer SA overlapping the scan gate electrode SG is defined as a channel region. Similarly, a part of the sensing line RL overlapping the sensing semiconductor layer EA is a sensing gate electrode EG, and a region of the sensing semiconductor layer EA overlapping the sensing gate electrode EG is defined as a channel region. On the other hand, one end of a driving semiconductor layer DA of the driving thin-film transistor DT is in contact with the driving source electrode DS and overlaps the driving gate electrode DG, and the other end is connected to the driving drain electrode DD.

Here, an area of a pixel P is defined between two neighboring sensing lines RL. The sensing lines RL are disposed to cross the entire flexible substrate FS. A trench TR which is an area from which an inorganic material film is removed is formed along the sensing line RL. Accordingly, the trench TR is also disposed to cross the entire flexible substrate FS. A metal material is stacked on and under the trench TR to form the sensing line RL.

A structure of a trench TR and structures of the lower metal layer BSL and the sensing line RL under and on the trench TR according to an embodiment of the present disclosure will be described in detail with reference to FIG. 3. A flexible electroluminescence display device according to an exemplary embodiment of the present disclosure includes a flexible substrate FS and a pixel array layer 120.

The flexible substrate FS is a base substrate and is formed of a plastic material or a glass material. For example, the flexible substrate FS may be formed of an opaque material or a colored polyimide material. For example, a flexible substrate FS formed of a polyimide material may be formed by curing a polyimide resin which is provided on a relatively thick carrier substrate and with which the front surface of a release layer is coated with a constant thickness. In this case, the carrier glass substrate is separated from the flexible substrate FS by releasing the release layer through a laser release process. This flexible substrate FS may further include a back plate which is coupled to the rear surface of the flexible substrate FS with respect to a thickness direction (Z). The back plate holds the flexible substrate FS in a planar state. For example, the back plate may be formed of a polyethylene terephthalate material. The back plate may be laminated on the rear surface of the flexible substrate FS which has been separated from the carrier glass substrate.

For example, the flexible substrate FS may be a flexible glass substrate. For example, a flexible substrate FS formed of a glass material may be a thin glass substrate having a thickness of 100 micrometers or less or may be a glass substrate which has been etched to have a thickness of 100 micrometers or less through a substrate etching process.

In one embodiment, the flexible substrate FS is formed of a material having excellent flexibility which is foldable and unfoldable. The flexible substrate FS includes a display area AA and a non-display area IA surrounding the display area AA.

A light blocking layer BS and a lower metal layer BSL are formed on the flexible substrate FS. The light blocking layer BS is disposed at a position overlapping the semiconductor layers SA, DA, and EA of the thin-film transistors ST, DT, and ET. The lower metal layer BSL is disposed in the same size (i.e., width) as the sensing line RL. The light blocking layer BS has an independent island shape in each pixel. Alternatively, the light blocking layer BS may have a structure in which light blocking layers BS disposed in pixels in the transverse direction are integrally connected. In one embodiment, the light blocking layer BS and the lower metal layer BSL be separated from each other.

A buffer layer BUF is formed on the flexible substrate FS on which the light blocking layer BS and the lower metal layer BSL are formed. The buffer layer BUF is formed on the flexible substrate FS to reduce moisture from permeating the pixel array layer 120 via the flexible substrate FS which is weak to moisture. For example, the buffer layer BUF may be formed of a plurality of inorganic films which are alternately stacked. For example, the buffer layer BUF may be formed of a multi-layered film in which one or more inorganic films of a silicon oxide film (SiOx), a silicon nitride film (SiNx), and SiON are alternately stacked.

The pixel array layer 120 includes a thin-film transistor layer, a planarization layer PLN, a bank pattern BN, and a light emitting element ED.

The thin-film transistor layer is provided in a plurality of pixels P which are defined in the display area AA of the flexible substrate FS and the gate driving circuit 200 which is defined in the third and/or fourth non-display area IA3 and/or IA4 of the flexible substrate FS.

For example, the thin-film transistor layer includes a thin-film transistor, a gate insulating film GI, and an intermediate insulating film ILD which are formed on the buffer layer BUF. Here, a driving thin-film transistor DT that is electrically connected to the light emitting element ED is illustrated in FIG. 3.

The driving thin-film transistor DT includes a driving semiconductor layer DA, a driving gate electrode DG, a driving source electrode DS, and a driving drain electrode DD which are formed on the buffer layer BUF. The driving thin-film transistor DT illustrated in FIG. 3 has a top gate structure in which the driving gate electrode DG is located above the driving semiconductor layer DA, but the present disclosure is not limited thereto. For example, the driving thin-film transistor DT may have a bottom gate structure in which the driving gate electrode DG is located below the driving semiconductor layer DA or a double gate structure in which the driving gate electrode DG is located above and below the driving semiconductor layer DA.

The driving semiconductor layer DA is formed inside an area of the light blocking layer BS on the buffer layer BUF. The driving semiconductor layer DA is formed of a silicon-based semiconductor material, an oxide-based semiconductor material or an organic-based semiconductor material and has a single-layered structure or a multi-layered structure.

The gate insulating film GI is formed on the entire flexible substrate FS to cover the driving semiconductor layer DA. For example, the gate insulating film GI is formed of an inorganic film such as a silicon oxide film (SiOx), a silicon nitride film (SiNx) or a multi-layered film thereof.

The driving gate electrode DG is formed on the gate insulating film GI to overlap the driving semiconductor layer DA. The driving gate electrode DG is formed along with the scan line SL. For example, the driving gate electrode DG is formed of a single layer including one of molybdenum (Mo), aluminum (Al), chromium (Cr), gold (Au), titanium (Ti), nickel (Ni), neodymium (Nd), and copper (Cu) or an alloy thereof or multiple layers thereof.

An inorganic insulating film ILD1 is formed on the entire flexible substrate FS to cover the driving gate electrode DG and the gate insulating film GI. The inorganic insulating film ILD1, the gate insulating film GI, and the buffer layer BUF are patterned to form a trench TR that exposes the lower metal layer BSL.

A sensing line RL is formed by depositing a metal material on the inorganic insulating film ILD1 and the trench TR and patterning the metal material. The sensing line RL is physically and electrically connected to the lower metal layer BSL via the trench TR.

An organic insulating film ILD2 is applied on the flexible substrate FS on which the sensing line RL has been formed. The organic insulating film ILD2 provides a flat surface onto the driving gate electrode DG and the gate insulating film GI. That is, the trench TR is maintained in a surface state in which it is filled with the organic insulating film ILD2.

One end and the other end of the driving semiconductor layer DA are exposed by patterning the organic insulating film ILD2, the inorganic insulating film ILD1, and the gate insulating film GI. The driving source electrode DS and the driving drain electrode DD are formed by depositing a metal material on the organic insulating film ILD2 and patterning the metal material. At this time, the data line DL, the pixel driving power supply line PL, and the first electrode of the capacitor Cst which are illustrated in FIG. 2B can be formed together.

The driving source electrode DS and the driving drain electrode DD are formed on the intermediate insulating film ILD to overlap the driving semiconductor layer DA with the driving gate electrode DG interposed therebetween. The driving source electrode DS and the driving drain electrode DD are formed at the same time as forming the data line DL, the pixel driving power supply line PL, and the common power supply line CPL. That is, the driving source electrode DS, the driving drain electrode DD, the data line DL, the pixel driving power supply line PL, and the common power supply line CPL are formed through a process of patterning a source/drain electrode material at the same time.

The driving source electrode DS and the driving drain electrode DD are connected to the driving semiconductor layer DA via electrode contact holes that penetrate the organic insulating film ILD2, the inorganic insulating film ILD1, and the gate insulating film GI. The driving source electrode DS and the driving drain electrode DD are formed of a single layer including one of molybdenum (Mo), aluminum (Al), chromium (Cr), gold (Au), titanium (Ti), nickel (Ni), neodymium (Nd), or copper (Cu) or an alloy thereof or multiple layers thereof. Here, the driving source electrode DS of the driving thin-film transistor DT illustrated in FIGS. 2B and 3 is electrically connected to the pixel driving power supply line PL.

In this way, the thin-film transistors ST, DT, and ET provided in the pixel P of the flexible substrate FS constitute a pixel circuit PC. The gate driving circuit 200 disposed in the third and/or fourth non-display area IA3 and/or IA4 of the flexible substrate FS includes thin-film transistors equal or similar to the thin-film transistors ST, DT, and ET provided in the pixel P.

The planarization layer PLN is formed on the entire flexible substrate FS to cover the thin-film transistor layer. The planarization layer PLN provides a flat surface on the thin-film transistor layer. For example, the planarization layer PLN is formed of an organic film such as an acryl resin, an epoxy resin, a phenolic resin, a polyamide resin, or a polyimide resin.

For example, the planarization layer PLN may include a pixel contact hole PH that exposes the driving drain electrode DD of the driving thin-film transistor DT provided in the pixel P.

A pixel driving electrode AE is formed by depositing a conductive material on the planarization layer PLN and patterning the conductive material. A bank pattern BN is formed on the pixel driving electrode AE. The bank pattern BN is disposed on the planarization layer PLN and defines an opening area (or an emission area) in the pixel P of the display area AA. The bank pattern BN may be referred to as a pixel defining film.

Each light emitting element ED includes a pixel driving electrode AE, a light emitting layer EL, and a common electrode CE. The pixel driving electrode AE is formed on the planarization layer PLN and is electrically connected to the drain electrode DD of the driving thin-film transistor via the pixel contact hole PH formed in the planarization layer PLN. In this case, the edge portion other than the middle portion of the pixel driving electrode AE overlapping the opening area of the pixel P is covered by the bank pattern BN. The bank pattern BN covers the edge part of the pixel driving electrode AE to define the opening area of the pixel P.

For example, the pixel driving electrode AE may be formed of a metal material having high reflectance. For example, the pixel driving electrode AE may be formed a multilayered structure such as a stacked structure (Ti/Al/Ti) of aluminum (Al) and titanium (Ti), a stacked structure (ITO/Al/ITO) of aluminum (Al) and ITO, an APC alloy, or a stacked structure (ITO/APC/ITO) of an APC alloy and ITO or may be formed in a single-layered structure including one or an alloy of two or more selected from silver (Ag), aluminum (Al), molybdenum (Mo), gold (Au), magnesium (Mg), calcium (Ca), or barium (Ba).

The light emitting layer EL is formed on the entire display area AA of the flexible substrate FS to cover the pixel driving electrodes AE and the bank pattern BN. For example, the light emitting layer EL includes two or more light emitting portions which are vertically stacked to emit white light. For example, the light emitting layer EL may include a first light emitting portion and a second light emitting portion for emitting white light by mixing first light and second light. Here, the first light emitting portion emits first light and includes a blue light emitting portion, a green light emitting portion, a red light emitting portion, a yellow light emitting portion, and a yellow-green light emitting portion. The second light emitting portion includes a light emitting portion that emits second light having a complementary color relationship with the first light out of the blue light emitting portion, the green light emitting portion, the red light emitting portion, the yellow light emitting portion, and the yellow-green light emitting portion.

For example, the light emitting layer EL may include one of a blue light emitting portion, a green light emitting portion, and a red light emitting portion for emitting light of a color corresponding to a color set for the pixel P. For example, the light emitting layer EL may include one of an organic light emitting layer, an inorganic light emitting layer, and a quantum-dot light emitting layer or may have a stacked or mixed structure of an organic light emitting layer (or an inorganic light emitting layer) and a quantum-dot light emitting layer.

Additionally, the light emitting element ED may further include a functional layer for enhancing emission efficiency and/or lifespan of the light emitting layer EL.

The common electrode CE is formed to be electrically connected to the light emitting layer EL. The common electrode CE is formed in the entire display area AA of the substrate SUB to be commonly connected to the light emitting layers EL provided in the pixels P.

For example, the common electrode CE may be formed of a transparent conductive material or a semi-transmissive conductive material that can transmit light. When the common electrode is formed of a semi-transmissive conductive material, emission efficiency of light emitted from the light emitting element ED can be enhanced by a microcavity structure. Examples of the semi-transmissive conductive material include magnesium (Mg), silver (Ag), or an alloy of magnesium (Mg) and silver (Ag). Additionally, a capping layer that adjusts a refractive index of light emitted from the light emitting element ED to enhance emission efficiency of light may be further formed on the common electrode CE.

Although not illustrated in the drawings, an encapsulation layer may be further stacked on the light emitting element ED. The encapsulation layer serves to prevent moisture or particles from permeating the light emitting element ED.

Figure 4:
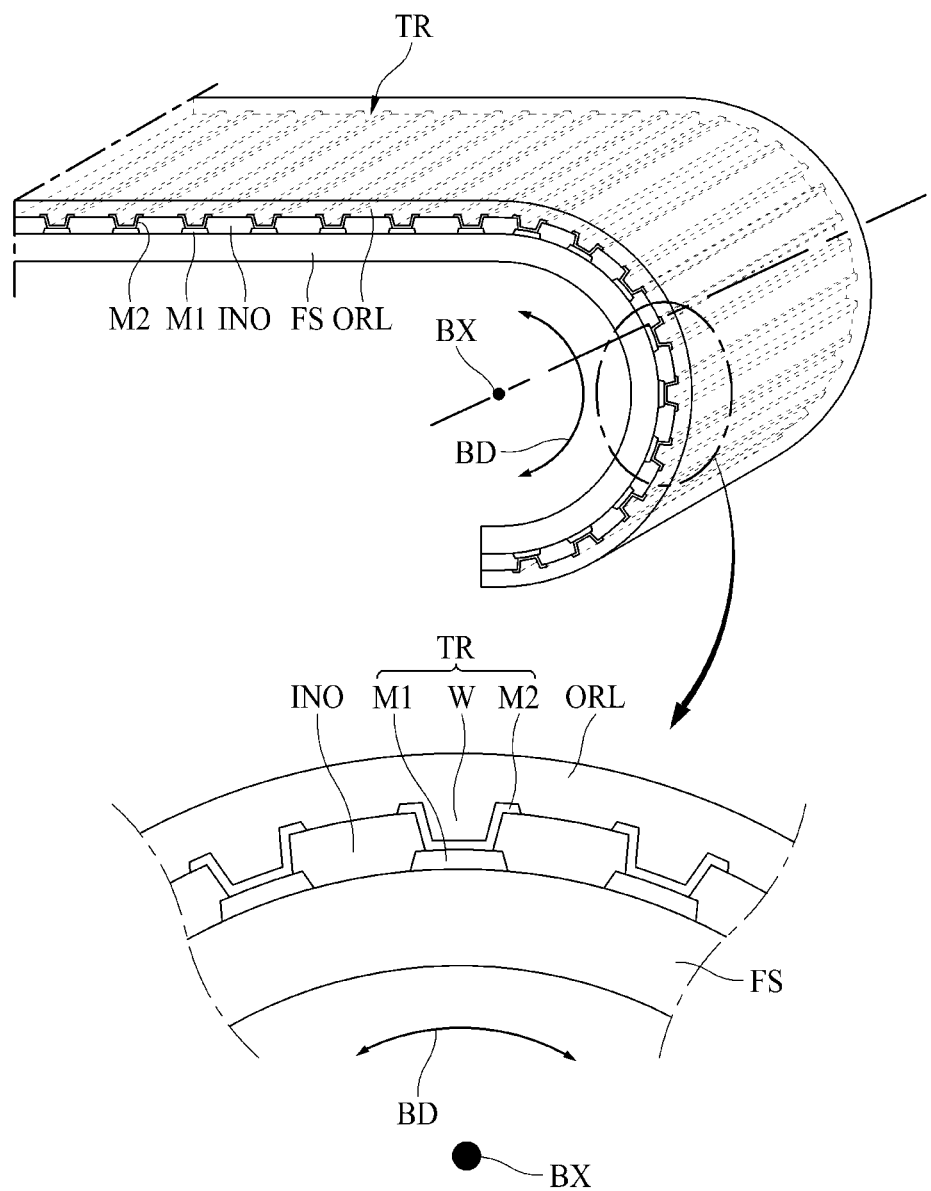
FIG. 4 is a perspective view illustrating a structure of a flexible electroluminescence display device according to an exemplary embodiment of the present disclosure in a state in which it is bent.

Structures and features of the foldable or rollable electroluminescence display device according to the present disclosure when a display board is bent or rolled will be described below in detail with reference to FIG. 4. FIG. 4 is a perspective view illustrating a structure of a flexible electroluminescence display device according to an exemplary embodiment of the present disclosure in a state in which it is bent. In FIG. 4, for the purpose of convenience of understanding, a trench part is enlarged and various stacked thin films are illustrated as a single layer.

A flexible electroluminescence display device according to an exemplary embodiment of the present disclosure includes a flexible substrate FS, a first metal layer M1, an inorganic material layer INO, a trench TR, a second metal layer M2, and an organic material layer ORL. The flexible substrate FS has a bending axis BX. The flexible substrate FS can be freely bent or rolled for storage or transportation with respect to the bending axis BX.

The bending axis BX is parallel to one axis of a plane of the flexible substrate FS. For example, when the flexible substrate FS has a quadrangular plate-shaped structure on the XY plane, the bending axis BX is defined as an X axis. The present disclosure is not limited thereto and the bending axis BX may be defined as a Y axis or may be defined as a diagonal direction of 45 degrees.

When the flexible substrate FS is bent, both sides of the flexible substrate FS parallel to the bending axis BX may meet each other or may be rolled up while one side is located below the other side. The direction in which the flexible substrate FS is bent or rolled up is defined as a bending direction BD. The bending direction BD is perpendicular to the bending axis BX.

The first metal layer M1 is formed on the flexible substrate FS to be parallel to the bending axis BX. Particularly, the first metal layer M1 is disposed in a narrow and long shape to cross the flexible substrate FS, and a plurality of first metal layers M1 are arranged at constant intervals in the direction perpendicular to the bending axis BX, that is, the bending direction BD. Here, the first metal layer M1 is an element corresponding to the lower metal layer BSL which have been described above with reference to FIG. 3.

The inorganic material layer INO is stacked on the flexible substrate FS. The inorganic material layer INO is not stacked on the first metal layer M1. For example, the inorganic material layer INO may be selectively removed from only the first metal layer M1 after the inorganic material layer INO has been deposited on the flexible substrate FS on which the first metal layer M1 has been formed. The inorganic material layer INO includes the inorganic buffer layer BUF, the gate insulating film GI, and the inorganic insulating film ILD1 which have been described above with reference to FIG. 3.

The part from which the inorganic material layer INO is removed and from which the first metal layer M1 is exposed is a trench TR. The trench TR has a well shape in which the inorganic material layer INO has been removed. Particularly, the trench TR has a band-like groove shape which crosses the flexible substrate FS in parallel to the bending axis BX. The second metal layer M2 is formed in the trench TR to be in contact with the first metal layer M1. Here, the second metal layer M2 is an element corresponding to the sensing line RL which has been described above with reference to FIG. 3. The present disclosure is not limited thereto and the second metal layer M2 may be a metal line for another purpose or a dummy pattern that does not have any function.

The organic material layer ORL is stacked on the surface of the flexible substrate FS having the second metal layer M2 formed thereon. Particularly, the organic material layer ORL fills the trench TR which is formed by removing the inorganic material layer INO such that the top surface is flat. Here, the organic material layer ORL includes the organic insulating film ILD2, the planarization film PLN, and the bank pattern BN which have been described above with reference to FIG. 3.

The flexible electroluminescence display device according to the present disclosure includes a plurality of trenches TR that are formed in parallel to a bending axis BX and that are arranged at constant intervals in the direction perpendicular to the bending axis BX. Each trench TR has a narrow and long bar shape that extends along the bending axis BX of the flexible substrate FS.

The trench TR is formed by removing the inorganic material layer INO stacked in a predetermined area on the flexible substrate FS. Since the inorganic material layer INO is patterned, there is high likelihood that moisture will permeate via the trench TR. In order to prevent this problem, the trench has a structure in which a patterned recessed portion W of the trench TR is encapsulated by forming the first metal layer M1 under the recessed portion W and forming the second metal layer M2 thereon.

The recessed portion W of the trench TR is filled with the organic material layer ORL. Since the recessed portion W is filled with the organic material layer ORL, the trench TR has a flat surface. Accordingly, the display panel including the trenches TR can be kept in a flat plate shape. Since the inorganic material layer INO is removed from the trench TR, cracking or damage due to repeated bending motions is not caused in the inorganic material layer INO. Since the trench TR is filled with the organic material layer ORL, a stress due to repeated bending motions can be satisfactorily absorbed. Since the etched side wall of the inorganic material layer INO removed from the trench TR, that is, the recessed portion W, is protected by the first metal layer M1 and the second metal layer M2, a path through which moisture permeates from the outside can be cut off.

The foldable or rollable electroluminescence display device according to the present disclosure provides a structure that can absorb and/or distribute a stress due to repeated bending motions to prevent damage of an inorganic material film and prevent permeation of moisture from the outside.

For example, in a foldable electroluminescence display device, the trench TR may be disposed in only a bending area. In the foldable electroluminescence display device, the bending axis BX may be fixed as the X axis. In this case, the trench TR may be disposed in some areas including folding areas which are defined upward or downward from the bending axis BX. That is, the trenches can be formed in a band shape crossing the flexible substrate FS in the X-axis direction in each of several tens or hundreds of pixel rows which are disposed in an area slightly broader than the folding areas. The trench TR may not be disposed in a non-bending area. In some cases, in a product in which fine difference in image quality is expected to occur due to presence or absence of the trench TR, the trenches TR may be disposed in the non-bending area in the same way.

For example, a rollable electroluminescence display device is rolled up and stored when it is not used, and the rollable electroluminescence display device is unrolled flat to use a display function when it is used as a display device. In this case, since the display panel should be rolled up, in one embodiment the trenches TR are disposed in a uniform distribution in the entire display panel.

The EL display device according to the embodiment of the present disclosure can be applied to various products such as a television, a notebook personal computer (PC), a monitor, a refrigerator, a microwave oven, a washing machine, and a camera in addition to mobile electronic devices such as an electronic notebook, an electronic book, a portable multimedia player (PMP), a navigation device, an ultra-mobile PC (UMPC), a smartphone, a mobile communication terminal, a mobile phone, a tablet PC, a smart watch, a watch phone, and a wearable device.

The above-described feature, structure, and effect of the present disclosure are included in at least one embodiment of the present disclosure, but are not limited to only one embodiment. Furthermore, the feature, structure, and effect described in at least one embodiment of the present disclosure may be implemented through combination or modification of other embodiments by those skilled in the art. Therefore, content associated with the combination and modification should be construed as being within the scope of the present disclosure.

The flexible electroluminescence display device according to the present disclosure has a structure that can relax or absorb a stress even when folding and unfolding motions are repeated. As a result, cracking or damage does not occur in spite of repeated folding motions. The flexible electroluminescence display device according to the present disclosure has a structure that is robust to a bending stress and can prevent permeation of moisture and particles from the outside.

In addition to the above-mentioned advantageous effects of the present disclosure, other features and advantages of the present disclosure will be described below or can be clearly understood by those skilled in the art from such description or explanation.

While embodiments of the present disclosure have been described above in detail in conjunction with the accompanying drawings, the present disclosure is not limited to the embodiments and can be modified and implemented in various forms without departing from the technical spirit of the present disclosure. Accordingly, the embodiments disclosed in the present disclosure are not for limiting the technical spirit of the present disclosure but for explaining it, and the scope of the technical spirit of the present disclosure is not limited by the embodiments. Therefore, the above-mentioned embodiments should be understood to be exemplary, not definitive, in all respects. The scope of the present disclosure should be defined by the appended claims, and all the technical spirits in equivalent ranges thereof should be construed to belong to the scope of the present disclosure.

What is claimed is:

1. An electroluminescence display device comprising:
    a flexible substrate that has a bending axis;
    a first metal layer that is disposed on the flexible substrate to be parallel with the bending axis;
    an inorganic material layer that is stacked on the first metal layer;
    a recessed portion that is disposed in the inorganic material layer to be parallel to the bending axis and exposes the first metal layer;
    a second metal layer that extends in parallel to the bending axis, covers the recessed portion, and is in contact with the first metal layer; and
    an organic material layer that covers the inorganic material layer and the second metal layer,
    wherein the inorganic material layer includes an inorganic buffer layer, a gate insulating film, and an intermediate insulating film, and
    wherein the organic material layer includes an organic insulating film, a planarization film, and a bank.

2. The electroluminescence display device according to claim 1, wherein the flexible substrate includes:
    a display area in which a plurality of pixels are arranged in a matrix; and
    a non-display area that is disposed to surround at least a part of the display area, and wherein each pixel includes:
        a light emitting element; and
        a thin-film transistor that drives the light emitting element.

3. The electroluminescence display device according to claim 2, wherein the plurality of pixels are defined by scan lines which are arranged in a first direction of the flexible substrate and data lines and driving current lines which are arranged in a second direction of the flexible substrate,
    wherein thin-film transistors of the plurality of pixels are connected to the scan lines, the data lines, and the driving current lines, and
    wherein light emitting elements of the plurality of pixels are connected to the thin-film transistors.

4. The electroluminescence display device according to claim 3, further comprising:
    an inorganic buffer layer that is stacked on the flexible substrate to expose the first metal layer;
    a semiconductor layer that is formed on the inorganic buffer layer;
    a gate insulating film that is formed to cover the semiconductor layer and exposes the first metal layer;
    a gate electrode that is formed on the gate insulating film to overlap a central portion of the semiconductor layer;
    an intermediate insulating film that is formed to cover the gate electrode and the semiconductor layer and exposes the first metal layer; and
    an organic insulating film that is formed on the intermediate insulating film to cover the intermediate insulating film and the second metal layer connected to the first metal layer via the recessed portion.

5. The electroluminescence display device according to claim 4, further comprising:
    a source electrode that is formed on the organic insulating film and is connected to one side of the semiconductor layer and a drain electrode that is formed on the organic insulating film and is connected to another side of the semiconductor layer;
    a planarization film that is formed to cover the organic insulating film, the source electrode, and the drain electrode;
    a pixel electrode that is formed on the planarization film and is connected to the drain electrode;
    a bank that is formed on the planarization film to expose a central area of the pixel electrode;
    a light emitting layer that is stacked on the pixel electrode which is exposed from the bank; and
    a common electrode that is stacked on the light emitting layer,
    wherein the organic insulating film, the planarization film, and the bank are stacked in the recessed portion.

6. The electroluminescence display device according to claim 1, wherein the recessed portion crosses the flexible substrate along the bending axis, and
    wherein a plurality of recessed portions of which each is identical to the recessed portion are arranged at constant intervals in a direction perpendicular to the bending axis.

7. The electroluminescence display device according to claim 6, wherein one or more of the plurality of recessed portions are disposed in a partial area including a folding area which is set on the flexible substrate.

8. The electroluminescence display device according to claim 6, wherein the plurality of recessed portions are disposed in a constant distribution on the flexible substrate in its entirety.

9. An electroluminescence display device comprising:
a flexible substrate;
a bending axis that is set to a first direction of the flexible substrate;
a thin-film transistor layer that is stacked on the flexible substrate;
a planarization film that is stacked on the thin-film transistor layer;
a light emitting element that is formed on the planarization film; and
a trench bar that is formed in the first direction on the flexible substrate,
wherein the trench bar includes:
a recessed portion that is disposed between the flexible substrate and the planarization film to cross the flexible substrate in the first direction;
a first metal material layer that is disposed under the recessed portion;
an inorganic material layer that is disposed on the first metal layer;
a second metal material layer that is disposed on the recessed portion and is in contact with the first metal material layer, and
an organic material layer that covers the inorganic material layer and the second metal layer,
wherein the inorganic material layer includes an inorganic buffer layer, a gate insulating film, and an intermediate insulating film, and
wherein the organic material layer includes an organic insulating film, the planarization film, and a bank.

10. The electroluminescence display device according to claim 9, wherein the light emitting element includes:
a pixel electrode that is formed on the planarization film and is connected to a thin-film transistor included in the thin-film transistor layer;
a bank that defines an emission area in the pixel electrode;
a light emitting layer that is stacked on the bank and the pixel electrode; and
a common electrode that is stacked on the light emitting layer.

11. The electroluminescence display device according to claim 10, wherein the thin-film transistor layer includes:
a light blocking layer that is formed on the flexible substrate;
an inorganic buffer layer that is formed to cover the light blocking layer;
a semiconductor layer that is formed in an area of the light blocking layer and on the inorganic buffer layer;
a gate insulating film that is formed to cover the semiconductor layer;
a gate electrode that is formed on the gate insulating film to overlap a central portion of the semiconductor layer;
an inorganic insulating film that is formed to cover the gate insulating film and the gate electrode;
an organic insulating film that is stacked on the inorganic insulating film;
a source electrode that is formed on the organic insulating film and is in contact with one side of the semiconductor layer; and
a drain electrode that is formed on the organic insulating film and is in contact with another side of the semiconductor layer.

12. The electroluminescence display device according to claim 11, wherein the second metal layer, the organic insulating film, the planarization film, and the bank are sequentially stacked on the recessed portion.

13. The electroluminescence display device according to claim 12, wherein the organic insulating film fills the recessed portion on the second metal layer to make a top surface of the organic insulating film flat.

14. The electroluminescence display device according to claim 9, wherein a plurality of recessed portions are disposed in a partial area including a folding area which is set on the flexible substrate.

15. The electroluminescence display device according to claim 9, wherein a plurality of recessed portions are disposed in a constant distribution on the flexible substrate in its entirety.

16. An electroluminescence display device comprising:
a flexible substrate that has a bending axis;
a first metal layer that is disposed on the flexible substrate to be parallel with the bending axis;
an inorganic material layer that is stacked on the flexible substrate, wherein a recessed portion is disposed to be parallel to the bending axis to expose the first metal layer;
a second metal layer that extends in parallel to the bending axis, covers the recessed portion, and is in contact with the first metal layer; and
an organic material layer that covers the inorganic material layer and the second metal layer,
wherein the inorganic material layer includes an inorganic buffer layer, a gate insulating film, and an intermediate insulating film, and
wherein the organic material layer includes an organic insulating film, a planarization film, and a bank.

* * * * *